(12) United States Patent
Gao

(10) Patent No.: US 11,849,534 B2
(45) Date of Patent: Dec. 19, 2023

(54) MODULAR BASED DESIGN FOR DATA CENTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 59 days.

(21) Appl. No.: 17/359,067

(22) Filed: Jun. 25, 2021

(65) Prior Publication Data

US 2022/0418148 A1 Dec. 29, 2022

(51) Int. Cl.
*H05K 7/20* (2006.01)

(52) U.S. Cl.
CPC ......... *H05K 7/203* (2013.01); *H05K 7/20318* (2013.01); *H05K 7/20327* (2013.01)

(58) Field of Classification Search
CPC ............... H05K 7/203; H05K 7/20809; H05K 7/20318; H05K 7/20818; H05K 7/20236; H05K 7/20827; H05K 7/20327; H05K 7/20381; H05K 7/20836; H05K 7/2079; H05K 7/208; H05K 7/20272; H05K 7/20281; H05K 7/20654; H05K 7/2029; F28D 15/0266; G06F 1/20; G06F 2200/201; G06F 1/206
USPC .......... 361/700, 699, 679.53, 704, 689, 688; 165/104.33, 80.4, 104.21, 80.2; 257/714, 257/715; 62/434
See application file for complete search history.

(56) References Cited

U.S. PATENT DOCUMENTS

| | | | |
|---|---|---|---|
| 10,791,647 B1* | 9/2020 | Miyamura | H05K 7/1487 |
| 2007/0193300 A1* | 8/2007 | Tilton | F25B 43/04 |
| | | | 257/E23.088 |
| 2014/0007597 A1* | 1/2014 | Harvey | H05K 7/20318 |
| | | | 62/190 |
| 2014/0218861 A1* | 8/2014 | Shelnutt | H05K 7/20818 |
| | | | 361/679.53 |
| 2015/0060009 A1* | 3/2015 | Shelnutt | H05K 7/203 |
| | | | 165/11.1 |
| 2016/0249484 A1* | 8/2016 | Parizeau | H05K 7/20745 |
| 2019/0357379 A1* | 11/2019 | Kolar | H05K 7/20827 |
| 2021/0059079 A1* | 2/2021 | Keehn | H05K 7/20327 |
| 2022/0225528 A1* | 7/2022 | Chen | H05K 7/203 |
| 2022/0256744 A1* | 8/2022 | Le | H05K 7/20318 |

* cited by examiner

*Primary Examiner* — Mandeep S Buttar
(74) *Attorney, Agent, or Firm* — WOMBLE BOND DICKINSON (US) LLP

(57) ABSTRACT

The disclosure provides a system, for designing and developing immersion cooling in data centers. The system includes an internet technology (IT) tank that houses a computing device immersed in a two phase coolant; an aisle, in which the immersion tank is disposed, that captures a first vaporized portion of the two phase coolant escaped from the immersion tank; a condenser that transforms the first vaporized portion of the two phase coolant that escaped from the immersion tank into a first liquid portion of the two phase coolant; a second condenser captures and condenses a second portion of vapor; and a liquid distributor manages the cooling fluid and coolant fluid for the IT tank and two condensers.

15 Claims, 12 Drawing Sheets

MODULAR BASED DESIGN FOR DATA CENTERS

FIELD OF THE INVENTION

Embodiments of the present invention relate generally to data center cooling. More particularly, embodiments of the invention relate to multiphase cooling systems.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
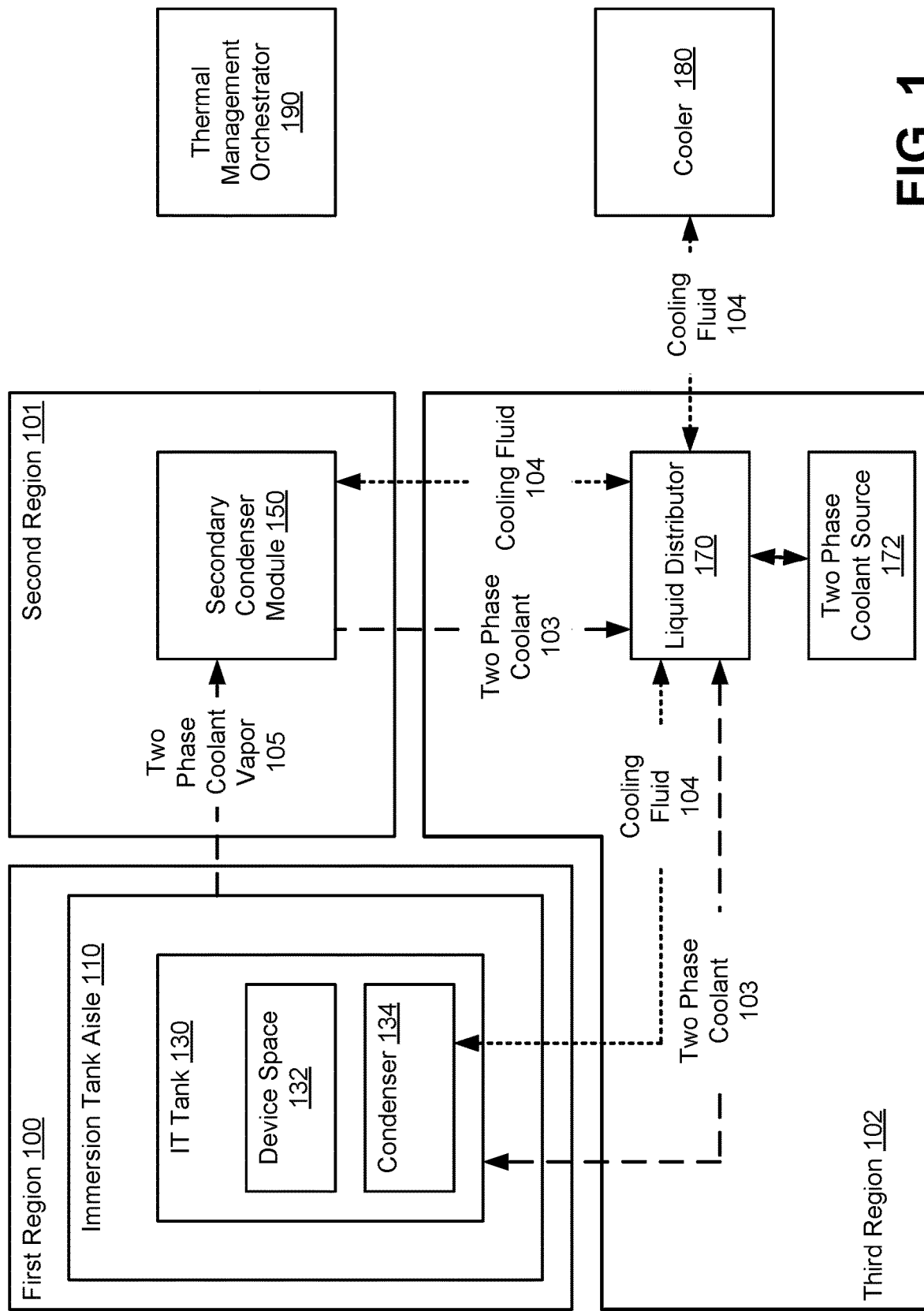
FIG. 1 is a block diagram illustrating a system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein generally relate to methods and systems for managing the thermal states (e.g., temperatures) of devices. The operation of the devices may depend on their thermal states. For example, elevated temperatures of devices may prevent successful operation of the devices, may decrease operating life of the devices, or may otherwise cause other undesirable outcomes.

A system in accordance with one embodiment manages the thermal states of devices using a multiphase loop (e.g., a two phase cooling loop). The multiphase loop may distribute two phase coolant (e.g., a coolant that undergoes at least one phase transition while circulating the multiphase loop) to internet technology (IT) tanks in which devices are disposed. The devices may be partially or completely immersed in the two phase coolant (e.g., a material that does not impair electrical function of the devices by causing short circuits or other changes in electrical resistance in the devices that are immersed in the material).

When the devices generate thermal loads (e.g., by their operation), the thermal loads may be transferred to the two phase coolant. Transferring the thermal loads out of the devices may cool or otherwise decrease the temperatures of the devices resulting in thermal regulation of the devices. The transferred thermal loads may cause a portion of the two phase coolant to vaporize which transfers the thermal load out of the liquid portion of the vaporized coolant thereby maintaining the thermal state of the device (e.g., within a desired temperature range).

However, by virtue of its gaseous state, the vaporized portion of two phase coolant may be subject to loss into an ambient environment (e.g., though imperfect seals, open lids, etc.). To prevent or limit loss of two phase coolant into the ambient environment, in one embodiment, the system includes an immersion tank aisle in which IT tanks are disposed. The immersion tank aisle may capture vaporized two phase coolant that escapes from the IT tanks. Note that throughout this application, an IT tank and an immersion tank are interchangeable terms.

The captured vaporized two phase coolant may be processed back into liquid two phase coolant. The liquid two phase coolant may be used to refill or otherwise maintain the fill level of two phase coolant in the IT tanks.

In one aspect, embodiments disclosed herein provide a system, computer readable medium, and computer-implemented method for thermally managing devices. The system includes an IT tank that houses a computing device immersed in a two phase coolant; an aisle, in which the IT tank is disposed, that captures a first vaporized portion of the two phase coolant escaped from the IT tank; a condenser that transforms the first vaporized portion of the two phase coolant that escaped from the IT tank into a first liquid portion of the two phase coolant; and a liquid distributor that manages a quantity of the two phase coolant in the IT tank using the liquid portion of the two phase coolant.

In one aspect, embodiments disclosed herein provide a modularized system. The modules of the modularized system may include different components thereby enabling a cooling system to be formed using the modules. A first module may include the IT tank and aisle. A second aisle may include the condenser. The liquid distributor may be a portion of either of these modules or may be part of a separate module.

A system, as discussed above, in accordance with embodiments may reduce or prevent the loss of two phase coolant used in multiphase thermal management systems. Consequently, a multiphase thermal management system (e.g., a cooling system) in accordance with embodiments disclosed herein may be less costly to operate, may be less likely to fail (e.g., due to lack of two phase coolant), may reduce two phase coolant pollution of the ambient environment surrounding the system, and/or may provide other benefits.

Further, the multiphase thermal management system may be of high efficiency and resilient by prevent loss of two phase coolant even when containers in which the two phase coolant is disposed are unsealed. The multiphase thermal management system may (i) have a simple architecture that makes it less expensive to implement when compared to other architectures, (ii) allow for dynamic variations in system operation and be flexible to accommodate changes in use cases, (iii) be modular and containerized to provide for flexibility in deployment and use case application, (iv) be applicable to multiple use case scenarios at the same time, and (v) be of high flexibility with respect to the types of devices, size of devices, and configurations of devices that will be thermally managed by the system.

FIG. 1 is a block diagram illustrating a system according to one embodiment of the invention. In FIG. 1 and the figures that follow, multiple flows of coolants and vapors are illustrated. These flow may be unidirectional (illustrated using lines that terminate in arrows on only one end) or bidirectional (illustrated using lines having both ends that terminate in arrows). In some figures, flows of two phase coolant 103 are illustrated using long dashed lines and flows of cooling fluid 104 are illustrated using short dashing lines. These flows may be portions of a single phase or multiphase loop. A single phase loop may be a loop in which the state of the flowing material is maintained in a single state (e.g., a liquid state). A multiphase loop may be a loop in which the state of the flowing material undergoes phase changes between at least two states (e.g., between a liquid state and a gaseous state, and the reverse).

Two phase coolant 103 may be used as part of the multiphase loop. Two phase coolant 103 may be adapted to (i) be placed in direct contact with devices without negative impacting the devices and (ii) vaporize at a temperature that maintains the devices in desired thermal states (e.g., temperature ranges in which the devices are designed to operate). Cooling fluid 104 may be used as part of the single phase loop. Cooling fluid may not be adapted to be placed in direct contact with the devices or vaporize while in the single phase loop. Rather, cooling fluid 104 may be adapted to stay in a liquid phase while the single phase loop is operating.

Two phase coolant 103 and cooling fluid 104 may include dissolved gasses, impurities, suspended materials, and/or be implemented using a mixtures of multiple materials without departing from embodiments disclosed herein.

Referring to FIG. 1, the system of FIG. 1 may facilitate thermal management of any number of devices (none, one, two, many, etc.). To facilitate thermal management of the devices, the system may utilize multiple types of coolants (i.e., two phase coolant and cooling fluid). The coolants may be used to transfer thermal loads from the devices to manage their respective thermal states. At least one of the coolants may be utilized as part of a multiphase loop in which the one coolant undergoes liquid to vapor phase change, and the reverse, when traversing through the multiphase loop. When the one coolant is transformed into a vapor, it may become more difficult to keep inside of the loop. If the one coolant is not kept within the multiphase loop, then the multiphase loop may fail (i.e., fail to transfer and dissipate thermal loads from the devices), the one coolant supply may need to be replenished which increases the operating cost of the multiphase loop, and/or the one coolant not kept within the multiphase loop may pollute or otherwise cause undesired impacts on the ambient environment proximate to the multiphase loop.

To facilitate thermal management of the devices, the system includes, but is not limited to, three regions 100, 101, 102. Each of the regions may perform similar and/or different functions to thermally manage the devices.

In one embodiments, first region 100 provides thermal load transfer services to the devices. Thermal load transfer services may include one or more of (i) transferring thermal loads from the devices into two phase coolant 103 in which the devices are disposed, (ii) capturing two phase coolant vapor 105 generated by virtue of the thermal loads transferred into two phase coolant 103, (iii) transforming two phase coolant vapor 105 to two phase coolant 103 by transferring the thermal loads from two phase coolant vapor 105 into cooling fluid 104, (iv) sending two phase coolant vapor 105 to second region 101 which may transform two phase coolant vapor 105 into two phase coolant 103, (v) maintaining levels of two phase coolant 103 in which the devices are disposed, and (vi) enabling physical access to the devices while limiting or prevent two phase coolant vapor 105 from escaping into the ambient environment. By doing so, first region 100 may facilitate thermal management of the devices in a manner that limits or prevents the loss of two phase coolant from a multiphase loop usable to transfer thermal loads from the devices.

To provide the thermal load transfer services, first region 100 includes, but is not limited to, immersion tank aisle 110, IT tank 130, device space 132, and condenser 134.

IT tank 130 may be a physical device in which devices that will be thermally managed are disposed. IT tank 130 may be implemented using a tank or other structure that includes device space 132 in which the devices may be disposed. Device space 132 may be an interior region of IT tank 130 in which the devices may be disposed and immersed in two phase coolant.

The devices disposed in IT tank 130 may include any type and quantity of devices. The devices may include computing devices that are part of a data center. The computing devices may provide any type and quantity of computer implemented services. While providing these services, the computing devices may generate heat that may need to be dissipated to manage the thermal states of the computing devices. The computing devices may include any number and type of hardware components that generate heat during operation including, but not limited to, processors, memory modules, storage devices, and communication devices.

IT tank 130 may be part of a multiphase loop. As part of the multiphase loop, IT tank 130 may be hydraulically connected to liquid distributor 170 (discussed in greater detail below).

When devices are disposed in device space 132 and immersed in two phase coolant 103, thermal loads generated by the devices may be transferred into two phase coolant 103. Transferring the thermal loads to two phase coolant 103 may (i) managing the thermal states of the devices by maintaining the temperatures of the devices within a range and (ii) cause a portion of two phase coolant 103 to undergo phase change from a liquid state to a gaseous state thereby generating two phase coolant vapor 105.

While IT tank 130 is sealed (e.g., against gas exchange with the ambient environment), the two phase coolant vapor 105 may generally be trapped within IT tank 130 (though some portion of the two phase coolant vapor 105 may escape out of IT tank 130). Condenser 134, disposed within IT tank 130, may transfer the thermal loads from two phase coolant vapor 103 into cooling fluid 104 thereby causing the portion of two phase coolant that vaporized to undergo a second phase change from the gaseous state back to the liquid state.

Cooling fluid 104 may be a part of a single phase loop that transfers the thermal loads transferred into cooling fluid to cooler 180. Cooler 180 may be part of the single phase loop and may dissipate thermal loads transferred into cooling fluid 104 by condenser 134 and/or secondary condenser module 150 (discussed in greater detail below).

Condenser 134 may be implemented using, but not limited to, a heat exchanger and/or a condenser. Cooling fluid 104 may be circulated through condenser 134 to maintain its temperature (e.g., while exposed to two phase coolant vapor 105) within a range that causes thermal loads transferred into the two phase coolant vapor (in IT tank 130) to be deposited into or otherwise transferred to cooling fluid 104. By doing so, two phase coolant vapor in IT tank 130 may condense into two phase coolant 103 thereby replenishing two phase coolant 103 disposed in device space 132 (e.g., maintaining the level of two phase coolant 103 in which devices are immersed in part and/or completely).

While IT tank 130 is not sealed (e.g., to enable a person to access a device disposed on IT tank 130), the two phase coolant vapor 105 (all or a portion) may escape out of IT tank 130. If lost to an ambient environment outside of the multiphase loop, the performance of the system of FIG. 1 may be impaired (e.g., limits its ability to manage thermal loads of devices, increasing the operation cost of the system, etc.). For additional details regarding IT tank 130, refer to FIGS. 2A, 2B, and 2C.

To prevent or limit loss of two phase coolant vapor 105, IT tank 130 may be disposed in immersion tank aisle 110. Immersion tank aisle 110 may be implemented using a physical device that may generally allow for any number of IT tank 130 to be disposed within it.

Immersion tank aisle 110 may (i) enable persons to physically access IT tank 130 and devices disposed therein, (ii) capture two phase coolant vapor 105 that escapes from IT tank 13) (and/or other types of devices disposed within immersion tank aisle 110), and (iii) transfer captured two phase coolant vapor 105 to secondary condenser module 150. By doing so, loss of two phase coolant 103 from the multiphase loop may be limited (e.g., in part or completely).

As part of the multiphase loop, immersion tank aisle 110 may be pneumatically connected to secondary condenser module 150. The pneumatic connection may enable two phase coolant vapor 105 captured by immersion tank aisle 110 to be transferred to secondary condenser module 150. For additional details regarding immersion tank aisle 110, refer to FIGS. 3A and 3B.

In one embodiments, second region 101 provides two phase coolant vapor 105 management services. Two phase coolant vapor management services may include one or more of (i) transferring thermal loads from two phase coolant vapor 105 into cooling fluid 104 to condense two phase coolant vapor 105 into two phase coolant 103, (ii) transferring cooling fluid 104 into which the thermal loads have been transferred to cooler 180, and (iii) transferring two phase coolant 103 to liquid distributor 170. By doing so, second region 101 may generate a liquid form of two phase coolant 103 usable to manage the thermal states of devices by transforming two phase coolant vapor 105 escaped from IT tank 130 into two phase coolant 103. Thus, two phase coolant 103 that has vaporized may be prevented from loss (in part or completely) from the system of FIG. 1 into the ambient environment (e.g., which may be a building or other environment in which computing devices may be housed).

To provide the two phase coolant vapor management services, second region 101 includes, but is not limited to, secondary condenser module 150. Secondary condenser module 150 may process two phase coolant vapor 105 obtained from immersion tank aisle 110 and/or other devices (e.g., other immersion tank aisles). Secondary condenser module 150 may process two phase coolant vapor 105 by transferring thermal load entrained in two phase coolant vapor 105 to cooling fluid 104 to condense two phase coolant vapor 105 into two phase coolant 103. The condensed two phase coolant 103 may be transferred to liquid distributor 170. Cooling fluid 104 to which the thermal loads have been transferred may be transferred to cooler 180 via liquid distributor 170 for dissipation purposes.

Secondary condenser module 150 may be implemented using one or more physical devices such as, for example, heat exchangers, condensers, and flow controllers (e.g., pumps). For additional details regarding secondary condenser module 150, refer to FIG. 4.

In one embodiments, third region 103 provides coolant management services. Coolant management services may include one or more of (i) managing the flows (e.g., flow rates) of two phase coolant 103 and cooling fluid 104 within the three regions (e.g., 100, 101, 102) to manage thermal loads and (ii) managing the levels of two phase coolant within IT tanks (e.g., removing it to enable persons to access devices disposed in IT tanks, to ensure that desired portions of devices are immersed in two phase coolant 103, to maintain the temperatures of cooling fluid 104 and two phase coolant 103, etc.). By doing so, third region 103 may improve the likelihood that devices disposed in IT tanks may be thermally managed using two phase coolant.

To provide the coolant management services, third region 102 includes, but is not limited to, liquid distributor 170, two phase coolant supply 172, and cooling liquid supply 174.

Liquid distributor 170 may maintain the operation of the single phase loop and the multiphase loop. To do so, liquid distributor 170 may (i) circulate cooling fluid 104 and two phase coolant 103 to condenser 134/secondary condenser module 150 and IT tank 130, respectively, (ii) obtain two phase coolant 103 from secondary condenser module 150 and/or two phase coolant supply 172, and (iii) circulate cooling fluid 104 to cooler 180 to dissipate thermal loads from the devices disposed in IT tank 130 that are transferred into cooling fluid (e.g., by condenser 134 and/or secondary condenser module 150).

Liquid distributor 170 may be implemented using any number of physical devices including, but not limited to, pipes for transferring the coolants from place to place, manifolds for distributing the coolants, flow controllers (e.g., pumps, sensors, etc.) for managing the rate and direction of flows, sensors for identifying various levels of coolants are various locations within the system of FIG. 1, storage tanks for storing reserves of the coolants, etc.

Two phase coolant supply 172 and cooling liquid supply 174 may store two phase coolant and cooling liquid, respectively. Each may be implemented using a tank that includes the respective fluids (any quantity of each fluid may be stored in the respective tanks). The respective supplies may be coupled to liquid distributor 170.

Cooler 180 may dissipate thermal loads in cooling fluid 104 into an ambient environment. By doing so, the thermal states of two phase coolant 103 and/or cooling fluid 104 may be managed (e.g., kept within ranges). Cooler 180 may be implemented using any type of devices that performs any cooling method without departing from embodiments disclosed here.

Thermal management orchestrator 190 may manage the operation of any of the components of FIG. 1. To do so, thermal management orchestrator 190 may obtain information regarding the thermal states of the various devices and/or coolants (e.g., from any number of sensors) and use the obtained information to set flowrates of coolants within the system (e.g., by instructing flow controllers or other devices to set the flowrates to ranges based on the obtained information).

Additionally, thermal management orchestrator 190 may enable physical access to devices disposed in IT tanks by managing the level of two phase coolant within the IT tanks. For example, when thermal management orchestrator 190 ascertains that a person desires to access a device, thermal management orchestrator 190 may decrease or otherwise modify a level of two phase coolant within an IT tank in which the device is disposed. Once thermal management orchestrator 190 determines that access to the device is no longer desired, then thermal management orchestrator 190 may return the level of two phase coolant within the IT tank to a different level used to maintain the thermal state of the devices disposed in the IT tank.

Similarly, thermal management orchestrator 190 may modify (e.g., increase, change direction, etc.) the rates of airflows proximate to IT tanks prior to and/or while unsealed to preferentially direct escaped two phase coolant vapors towards secondary condenser modules. While the IT tanks are sealed, thermal management orchestrator 190 may modify (e.g., decrease, change directions, etc.) airflows proximate to IT tanks to reduce energy consumption. To do so, thermal management orchestrator 190 may manage the operation of ventilation units, vapor management systems, and/or other devices that may include flow controller usable to modify airflows.

Thermal management orchestrator 190 may be implemented using a computing device. The computing devices may use a processor to execute computer instructions stored on a non-transitory computer readable medium that the processor to perform the functionality of the thermal management orchestrator discussed throughout this application.

Any of the components of FIG. 1 may be connected to one another via one or more wired and/or wireless networks (including, for example, the Internet). The components may communicate with one another via any number and type of communication schemes/protocols (e.g., predetermined methods of exchanging bit sequences in a form that is interpretable to identify information included in the bit sequences) and may be managed using any number and type of command and control schemes (e.g., message passing, publish-subscribe, leader-follower, etc. that may be used to cause any of the components of FIG. 1 to perform actions).

In one embodiment, the single phase loop includes condenser 134, secondary condenser module 150, liquid distributor 170, and cooler 180. The single phase loop may include additional devices without departing from embodiments disclosed herein.

In one embodiment, the multiphase loop includes immersion tank aisle 110, IT tank 130, secondary condenser module 150, and liquid distributor 170. The multiphase loop may include additional devices without departing from embodiments disclosed herein.

In one embodiments, regions 100, 101, 102 (and/or devices disposed there) are implemented as units, modules, or other types of physical constructs that may be efficiently integrated with one another to form the system illustrated in FIG. 1 and/or larger system that incorporate the system of FIG. 1. For example, any of regions 100, 101, 102 may be implemented as modules that are adapted to efficiently connect to one another to form the single phase and multiphase cooling loops used to thermally manage devices. The modules may include quick release fluid connectors and/or gaseous connectors disposed at corresponding locations on the modules to enable the single phase and multiphase loops to be quickly established. For additional details regarding modules and the interactions between the regions 100, 101, 102, refer to FIGS. 5-5E.

While illustrated in FIG. 1 as included a limited number of specific components, a system in accordance with one or more embodiments may include fewer, additional, and/or different components.

Figure 2A:
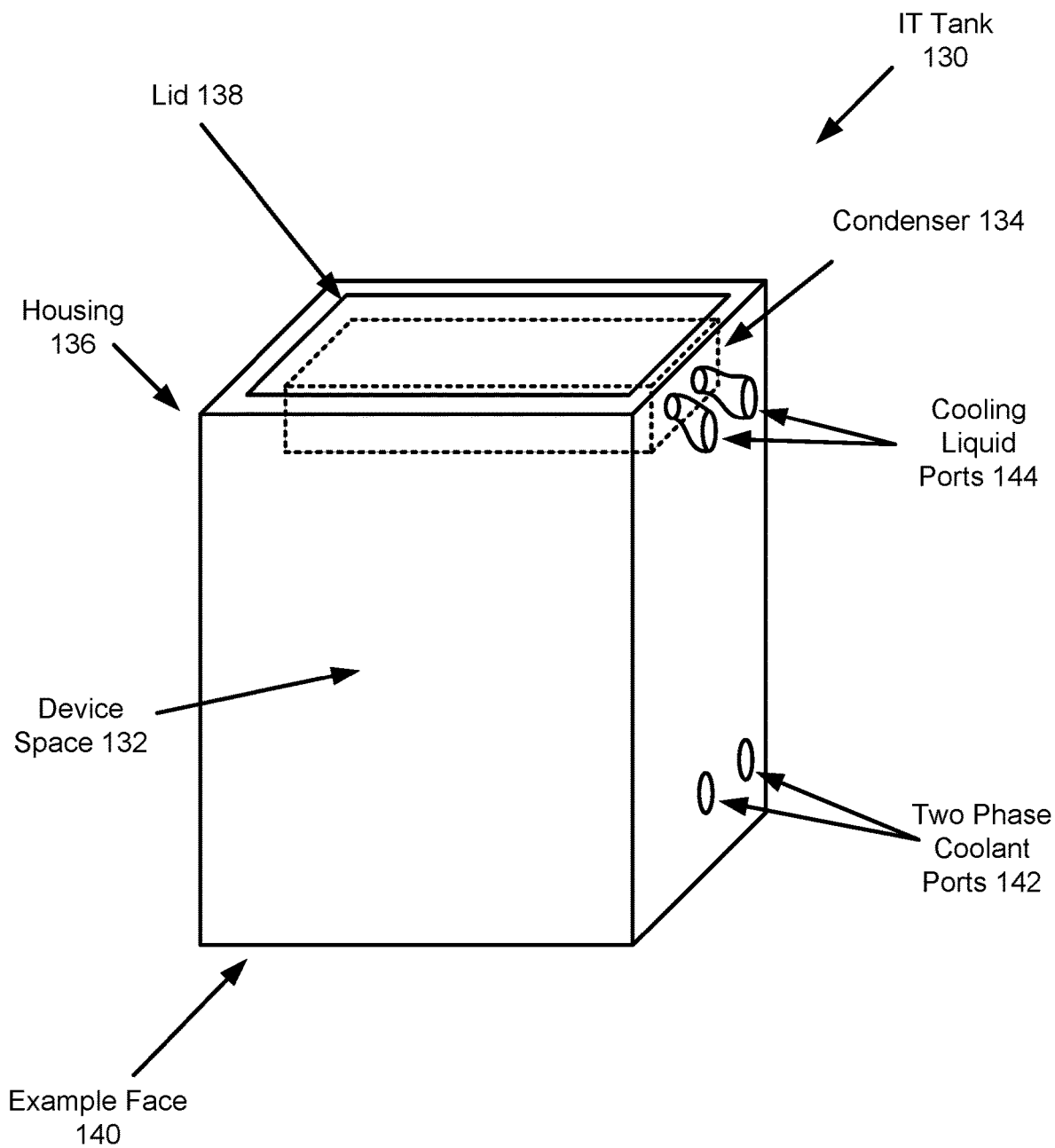
FIG. 2A is a diagram illustrating an IT tank according to one embodiment.

FIG. 2A is a diagram illustrating IT tank 130 in accordance with one embodiment. IT tank 130 may include housing 136 which delineates an interior region in which device space 132 and condenser 134 (drawn in FIG. 2a in dashing to indicate that it is disposed within housing 136) are disposed. Devices may be disposed in device space 132 and may be immersed in two phase coolant for thermal management purposes. Generally, condenser 134 may be disposed towards an upper portion of the interior region (e.g., above device space 132) so that evaporated portions of the two phase coolant in device space 132 are naturally directed toward it via convection.

Lid 138 may be disposed on a side of the housing. Generally, housing 136 may be sealed (may not be perfectly sealed, some vapor may still escape while lid is closed) while lid 138 is closed and unsealed while lid 138 is open. When unsealed, vaporized two phase coolant may escape into an ambient environment via lid 138.

Two phase coolant ports 142 may be disposed on housing 136. Two phase coolant ports 142 may allow two phase coolant to be added to, removed from, and/or circulated through from the interior of housing 136 without allowing two phase coolant and/or vaporized two phase coolant from escaping through two phase coolant ports 142. While illustrated as being on a side, two phase coolant ports 142 may be located in other locations without departing from embodiments disclosed herein. For example, a first (e.g., a fill port) of the two phase cooling ports may be disposed on a top of housing 136 while a second (e.g., a dump port out of which two phase coolant is removed) of the two phase coolant ports may be disposed on a lower portion of housing 136.

Cooling fluid ports 144 may be disposed on housing 136. Cooling fluid ports 144 may allow cooling fluid to be added to, removed from, and/or circulated through condenser 134 without allowing two phase coolant and/or vaporized two phase coolant from escaping through cooling fluid ports 144. Like two phase coolant ports, cooling liquid ports 144 may be disposed at other locations without departing from embodiments disclosed herein.

Housing 136 may generally have a shape such as a rectangular box, cylindrical tube, or other shape that allows for IT tank 130 to provide its functionality. The shape may include any number of faces including example face 140.

Housing 136 and the other components of IT tank 130 may be formed from any number of material such as, for example, metals, plastics, rubbers, and/or other materials that enable IT tank 130 to provide its functionality.

While illustrated in FIG. 2A as included a limited number of specific components, an IT tank in accordance with one or more embodiments may include fewer, additional, and/or different components.

Figure 2B:
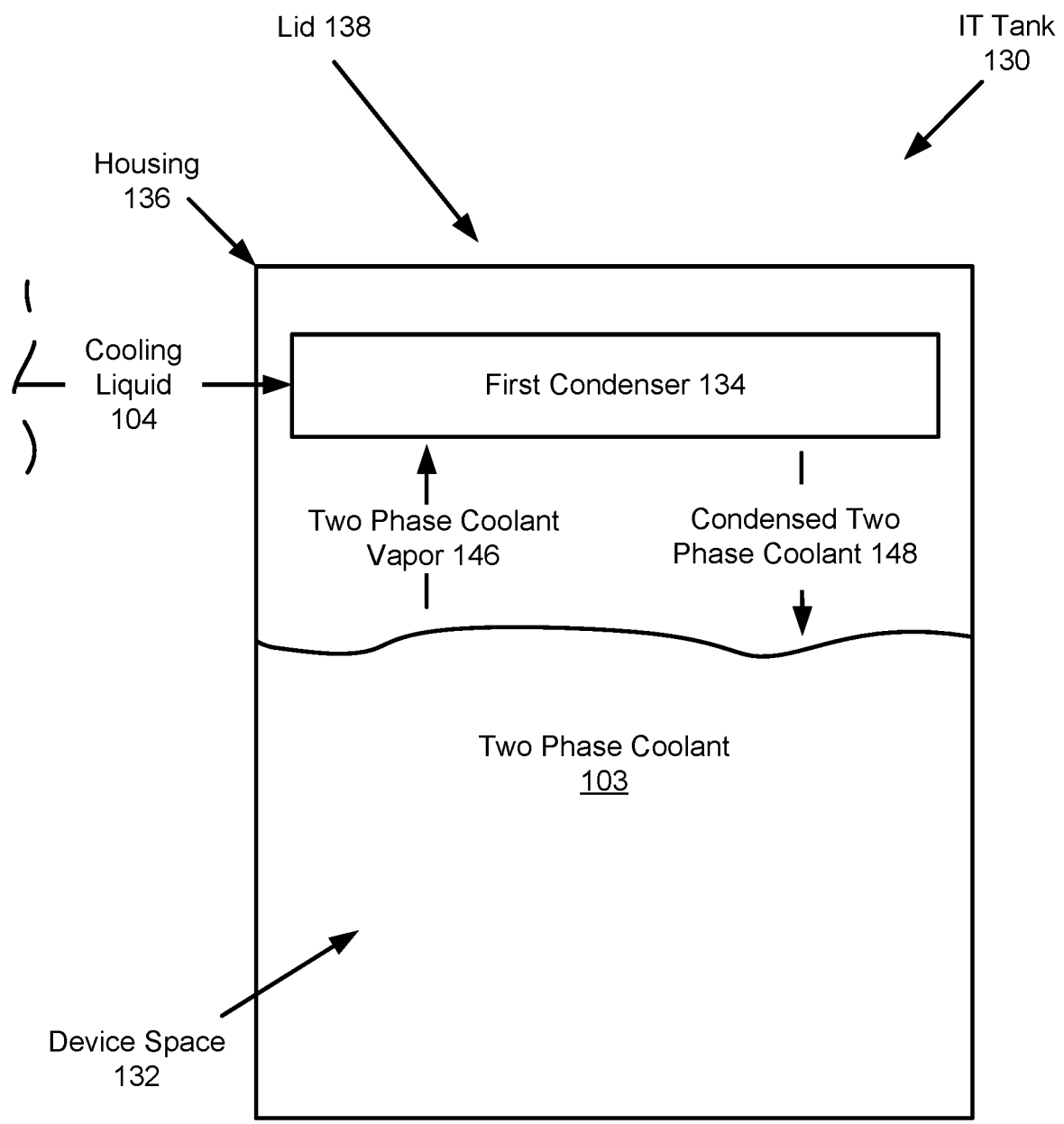
FIG. 2B is a first section diagram illustrating the IT tank according to one embodiment.

Turning to FIG. 2B, FIG. 2B shows a first section diagram of IT tank in a sealed configuration in accordance with one embodiment looking toward example face 140.

As seen in FIG. 2B, lid 138 is closed. While lid 138 is closed, thermal loads from devices (not shown) immersed in two phase coolant 103 are transferred (e.g., via conduction, convection, etc.) to two phase coolant 103 thereby maintaining the thermal states of the devices while the devices operate (e.g., perform functions that generate heat as a byproduct or direct result of the performed functions).

A portion of two phase coolant 103 vaporizes due to the transferred thermal loads resulting in the generation of two phase coolant vapor 146. Because IT tank 130 is in a sealed configuration, two phase coolant 146 is trapped within IT tank 130. Condenser 134 processes two phase coolant vapor 146 to obtain condensed two phase coolant vapor 148, which may be returned to two phase coolant 103.

Condenser 134 condenses two phase coolant vapor 146 using cooling fluid 104 (circulated through it) by transferring the thermal loads from two phase coolant vapor 146 into cooling fluid 104. By virtue of the circulation of cooling fluid 104 within condenser 134, the thermal loads transferred into cooling fluid 104 are transferred out of IT tank 130 thereby thermally managing the components disposed in IT tank 130, including any devices immersed in two phase coolant 103.

Figure 2C:
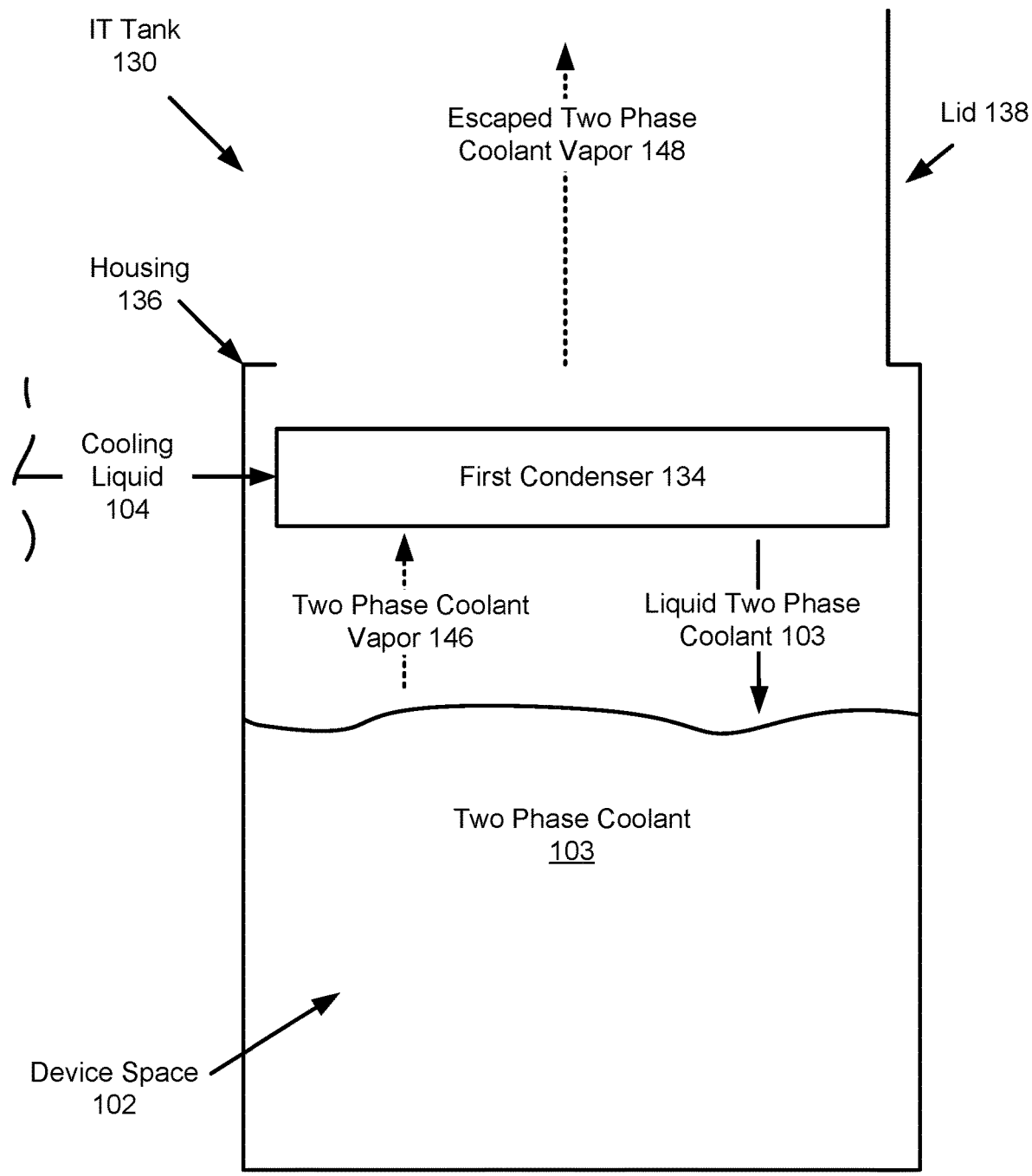
FIG. 2C is a second section diagram illustrating the IT tank according to one embodiment.

Turning to FIG. 2C, FIG. 2C shows a second section diagram of IT tank in an unsealed configuration in accordance with one embodiment looking toward example face 140 of FIG. 2A.

As seen in FIG. 2C, lid 138 is open. Lid 138 may be opened to, for example, physically access one or more devices disposed in the interior of housing 136. For example, if a device that is being thermally managed begins to malfunction, need to be upgraded (e.g., add/remove hardware), or needs to be physically accessed for other reasons, lid 138 may need to be opened to enable physical access to the device.

While lid 138 is open, thermal loads from devices (not shown) immersed in two phase coolant 103 are transferred (e.g., via conduction, convection, etc.) to two phase coolant 103 thereby maintaining the thermal states of the devices while the devices operate (e.g., perform functions that generate heat as a byproduct or direct result of the performed functions).

A portion of two phase coolant 103 vaporizes (or already vaporized by virtue of previous operation of devices disposed in IT tank 130) due to the transferred thermal loads resulting in the generation and/or presence of two phase coolant vapor 146. Because IT tank 130 is in the unsealed configuration (or even while sealed but at a lesser rate), at least a portion of two phase coolant 146 escapes out of IT tank 130 as escaped two phase coolant vapor 148 (even while condenser 134 operates, condenser 134 may not operate and/or be present in all embodiments disclosed herein). While lid 138 is open, vaporized two phase coolant may continue to be generated and/or escape from lid 138.

As will be discussed in greater detail below, escaped two phase coolant vapor 148 may be captured by an immersion tank aisle thereby limiting and/or prevent loss of two phase coolant.

Figure 3A:
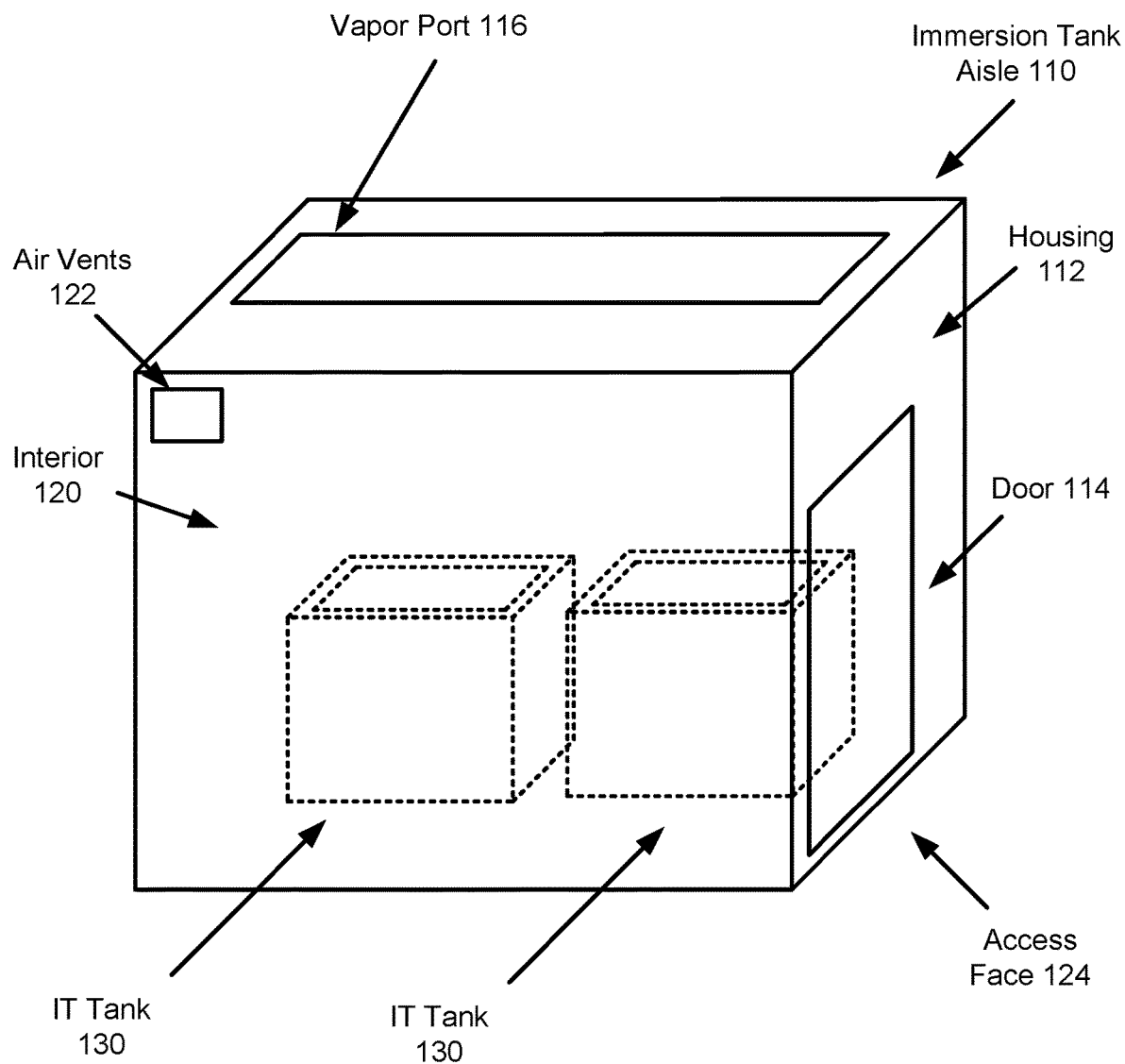
FIG. 3A is a diagram illustrating an immersion tank aisle according to one embodiment.

FIG. 3A is a diagram illustrating immersion tank aisle 110 in accordance with one embodiment. IT tank 130 may include housing 112 which delineates an interior 120 in which one or more of IT tank 130 (drawn in FIG. 3A in dashing to indicate that it is disposed within housing 136) may be disposed.

Housing 112 may generally seal interior 120 away from the ambient environment surrounding housing 112. Consequently, escaped two phase coolant vapor may be trapped within interior 120. Vapor port 116 may enable two phase coolant vapor trapped within interior 120 to be transported out of immersion tank aisle 110. Vapor port 116 may allow the trapped two phase coolant vapor to be transferred to a secondary condenser module for processing back into a liquid form of the two phase coolant. Vapor port 116 may be a hole in a side (e.g., top, side) of housing 112.

Door 114 may be disposed on housing 112 and allow for physical access to interior 120. Door 114 may be implemented as, for example, a door or other structure that may reversibly seal interior 120. The state (e.g., open, closed) of door 114 may be monitored using one or more sensors (not shown). The state of door 114 may be used to determine how to operate air vents 122.

Housing 112 may generally have a shape such as a rectangular box or other shape that allows for immersion tank aisle 110 to provide its functionality. The shape may include any number of faces including access face 124. Door 114 may be disposed on access face 124. Housing 112 and the other components of immersion tank aisle 110 may be formed from any number of material such as, for example, metals, plastics, rubbers, and/or other materials that enable immersion tank aisle 110 to provide its functionality.

While housing 112 is sealed, the temperature of interior 120 may become elevated. Air vents 122 may manage the thermal state of interior 120 by directing airflows into interior 120. To do so, air vents 122 may include any number of flow controllers (e.g., fans, baffles, etc.) usable to generate desired airflows. Air vents 122 may be pneumatically connected to a ventilation system of a structure in which immersion tank aisle 110 is disposed.

While illustrated in FIG. 3A as included a limited number of specific components, an immersion tank aisle in accordance with one or more embodiments may include fewer, additional, and/or different components.

Figure 3B:
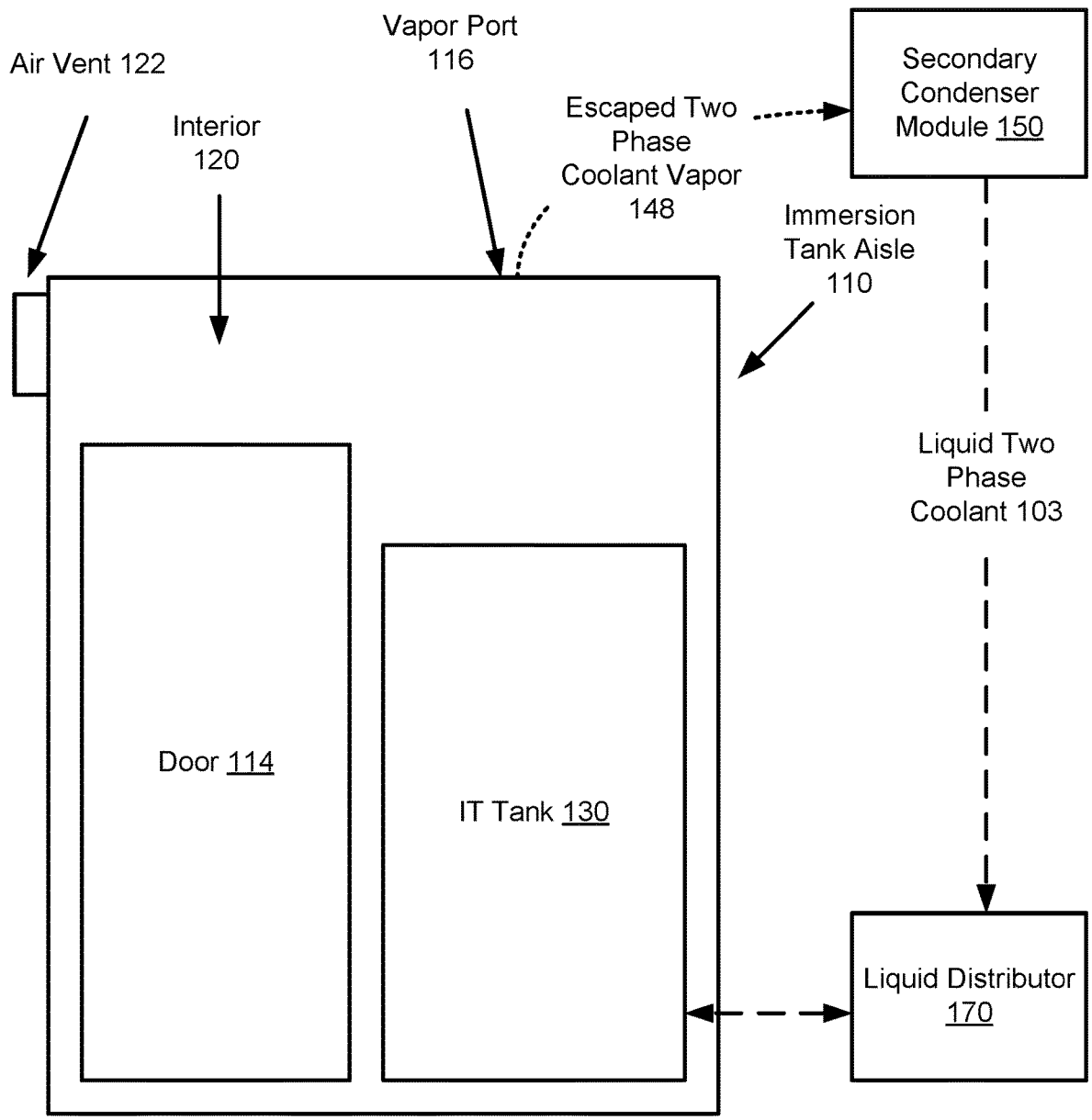
FIG. 3B is a side view diagram illustrating the immersion tank aisle according to one embodiment.

Turning to FIG. 3B, FIG. 3B shows a section diagram of immersion tank aisle 110 in accordance with one embodiment looking toward access face 124.

As seen in FIG. 3B, lid 138 may set to the side of where IT tank 130 is disposed in interior 120. A person that needs to physically access a device disposed in IT tank 130 may open door 114 to gain access to interior 120. Once in interior 120, the person may open IT tank 130 to gain access to the device disposed in IT tank 130. However, doing so may result in escaped two phase coolant vapor, as discussed with respect to FIG. 2C.

Once escaped two phase coolant vapor 148 is received by secondary condenser module 150, two phase coolant 103 is generated (e.g., by condensing the vapor) and directed to liquid distributor 170. In turn, liquid distributor 170 may use two phase coolant 103 (or other portions of two phase coolant obtained from other portions of escaped two phase coolant vapor) to manage a fill level of two phase coolant within IT tank 130.

Figure 4:
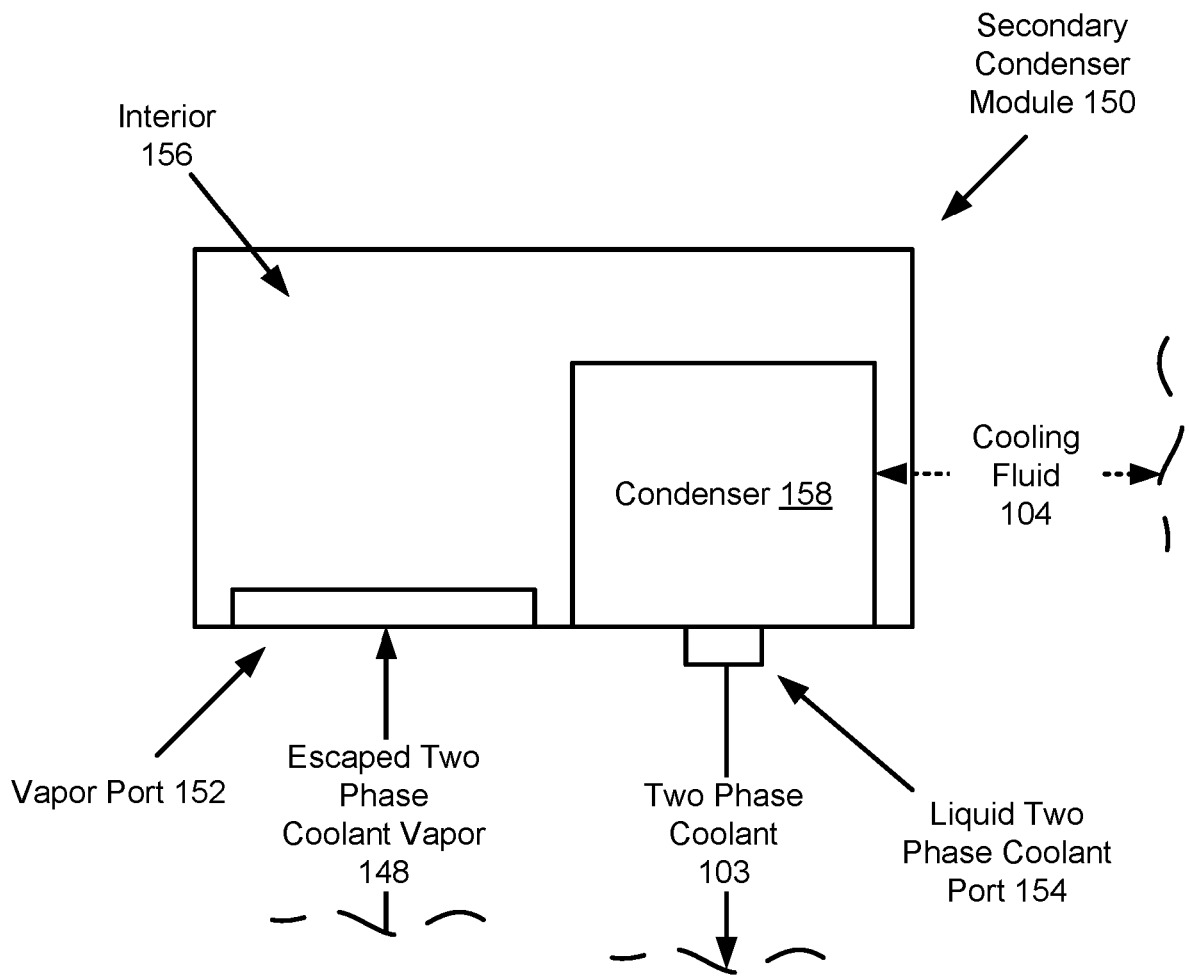
FIG. 4 is a block diagram illustrating a secondary condenser module according to one embodiment.

FIG. 4 is a block diagram illustrating secondary condenser module 150 in accordance with one embodiment. Secondary condenser module 150 may include condenser 158 disposed in interior 156. Interior 156 may be accessible via vapor port 152. Escaped two phase coolant vapor 148 may be directed into interior 156 via vapor port 152. Otherwise, interior 156 may be sealed from the ambient environment.

Condenser 158 may condense escaped two phase coolant vapor 148 into two phase coolant 103 using cooling fluid 104. Thermal load in escaped two phase coolant vapor 148 may be transferred to cooling fluid 104 as it circulates through condenser 158. Consequently, the thermal loads may be removed from secondary condenser module 150. As previously discussed, thermal loads transferred into cooling fluid 104 may be dissipated by cooler 180 shown in FIG. 1.

Two phase coolant 103 obtained by condenser 158 may be directed out of secondary condenser module 150 via condensed two phase coolant port 154 and toward liquid distributor 170 (not shown in FIG. 4).

Turning to FIGS. 5A-5E, these figures illustrate embodiments in which various components shown in FIGS. 1-4 are modularized and connected to one another to form single phase and multiphase loops.

Figure 5A:
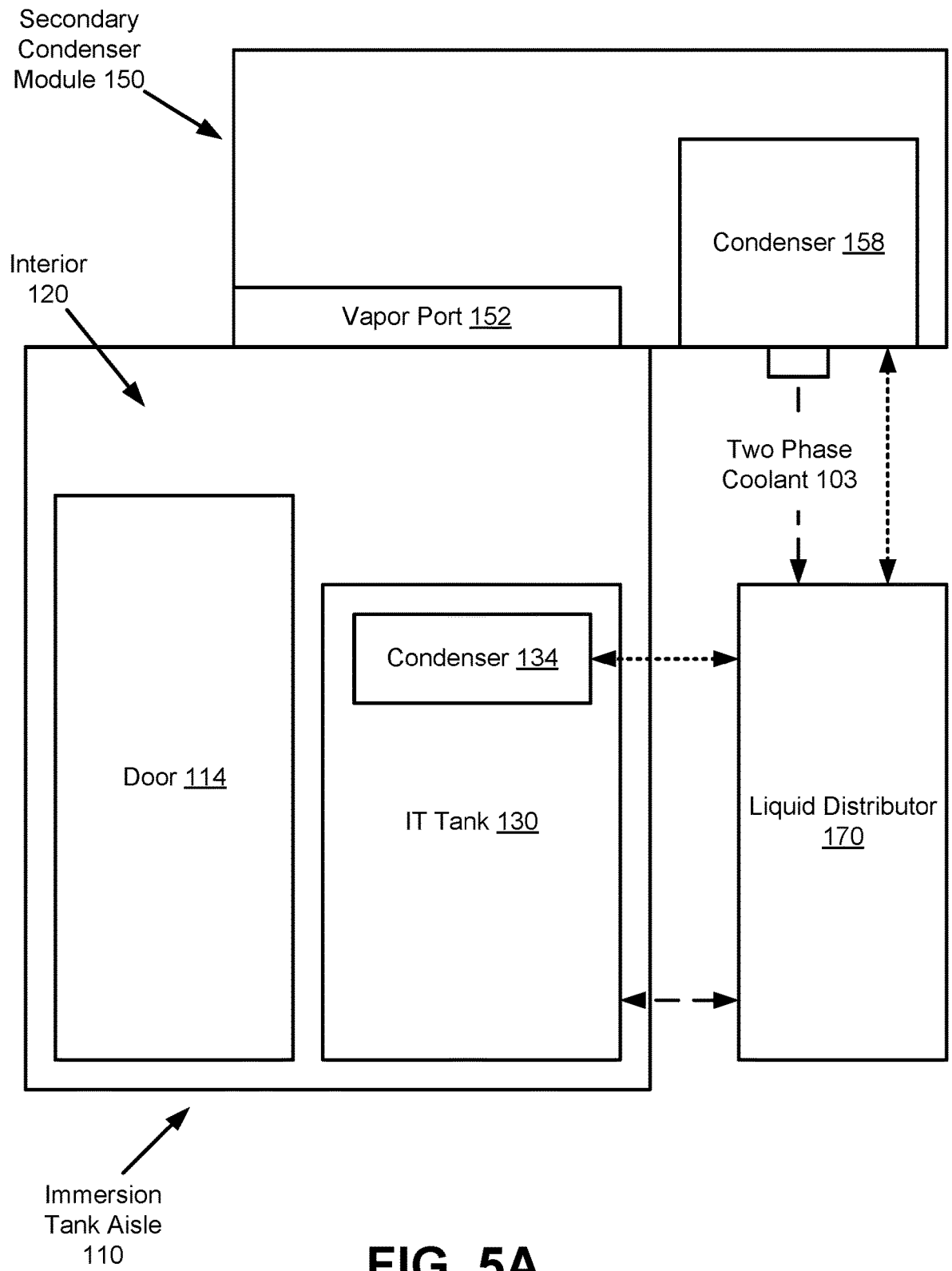
FIG. 5A is a block diagram illustrating a first arrangement of the system of FIG. 1 according to one embodiment.

FIG. 5A shows a diagram of a first arrangement of modularized components in accordance with one embodiment. As seen in the figure, secondary condenser module 150 is directly attached to immersion tank aisle 110 (e.g., a configuration in which secondary condenser module 150 is dedicated to immersion tank aisle 110, in contrast to other configurations illustrated in subsequent figures). When vaporized two phase coolant escapes from IT tank 130, it is directly transferred to secondary condenser module 150 for processing via vapor port 152. The vaporized two phase coolant may be processed to obtain two phase coolant 103 which may then be used to refill any IT tank (e.g., the IT tank out of which the two phase coolant vapor escaped or a different IT tank).

Liquid distributor 170 is separate from both the secondary condenser module 150 and immersion tank aisle 110. In this configuration, IT tank 130 could be accessed from both sides if an additional access port (not shown) is disposed on the housing of immersion tank aisle 110 (e.g., between liquid distributor 170 and IT tank 130).

Figure 5B:
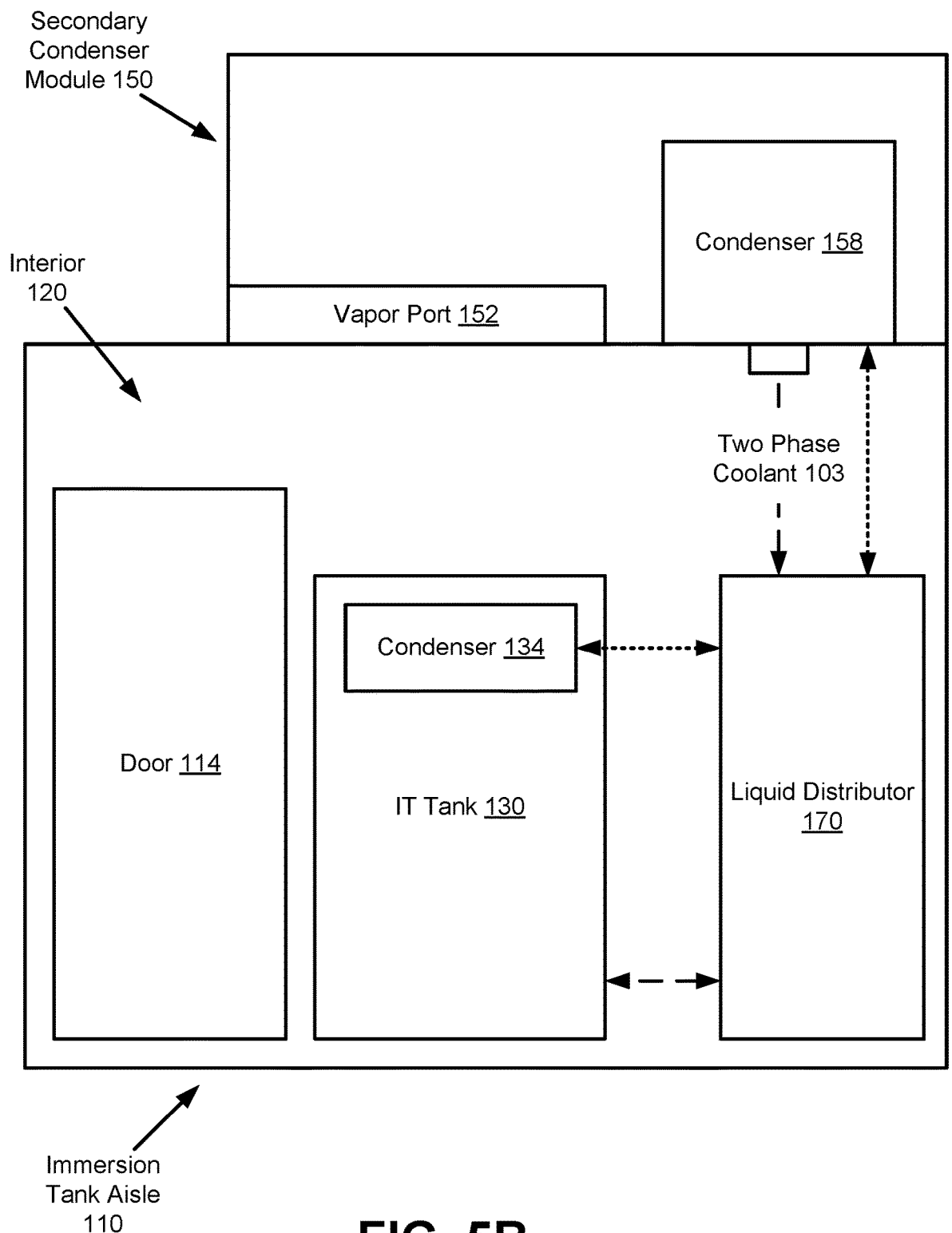
FIG. 5B is a block diagram illustrating a second arrangement of the system of FIG. 1 according to one embodiment.

FIG. 5B shows a diagram of a second arrangement of modularized components in accordance with one embodiment. As seen in the figure, the arrangement is similar to that as shown in FIG. 5A. However, liquid distributor 170 is disposed inside of immersion tank aisle 110 with secondary condenser module 150 being disposed on top of immersion tank aisle 110. In this configuration, deployment complexity of the components may be reduced by virtue of the smaller number of interconnections between the modularized components that need to be established to operate the single phase and multiphase loops.

Figure 5C:
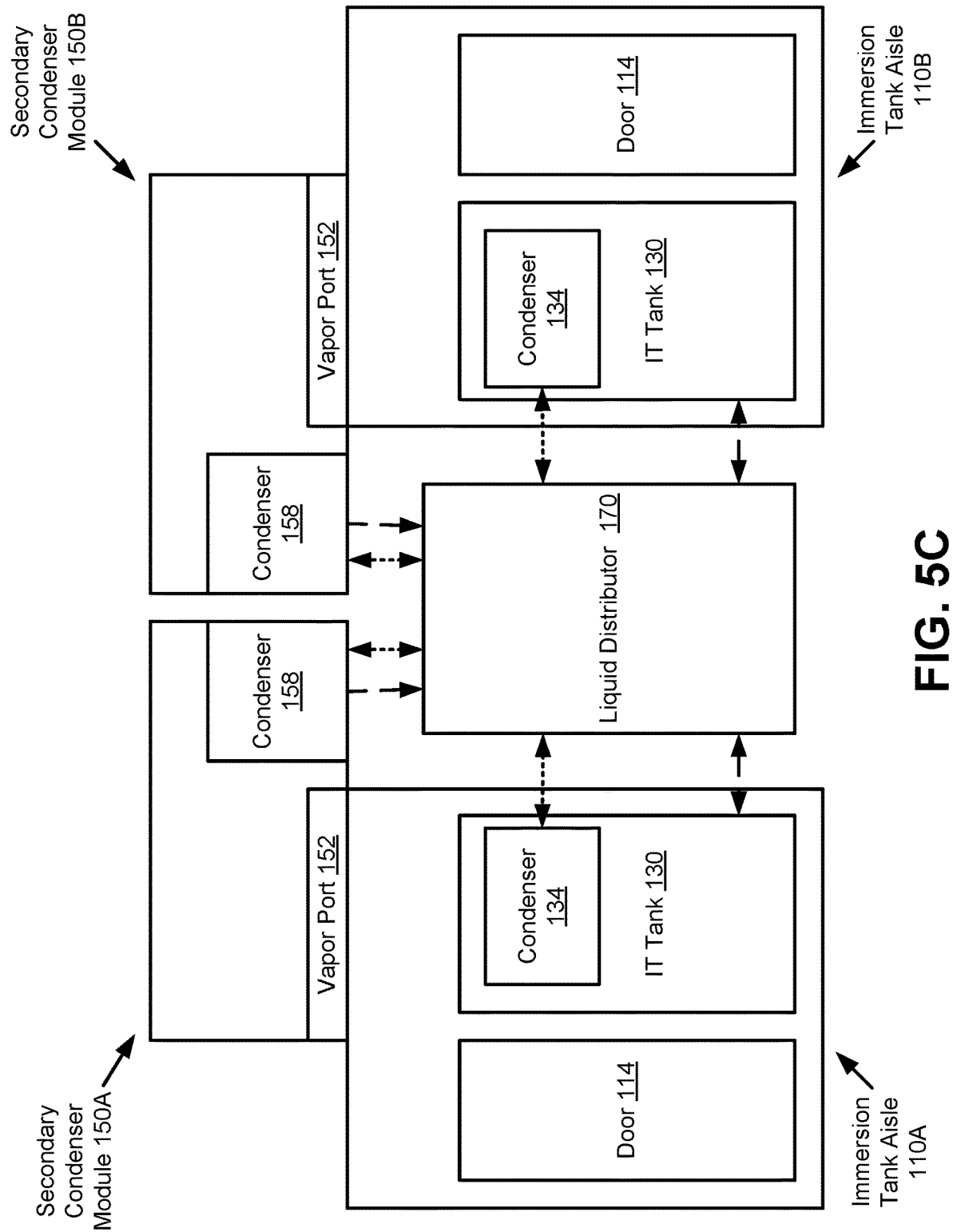
FIG. 5C is a block diagram illustrating a third arrangement of the system of FIG. 1 according to one embodiment.

FIG. 5C shows a diagram of a third arrangement of modularized components in accordance with one embodiment. In this figure, liquid distributor 170 is shared by two immersion tank aisles 100A, 100B and secondary condenser modules 150A, 150B. Such an arrangement may decrease the number of modularized units necessary to operate the single phase and multiphase loops. For example, liquid distributor 170 may receive two phase coolant from both immersion tank aisles 100A, 100B and manage a fluid level of two phase coolant in the IT tanks in both immersion tank aisles 100A, 100B.

Figure 5D:
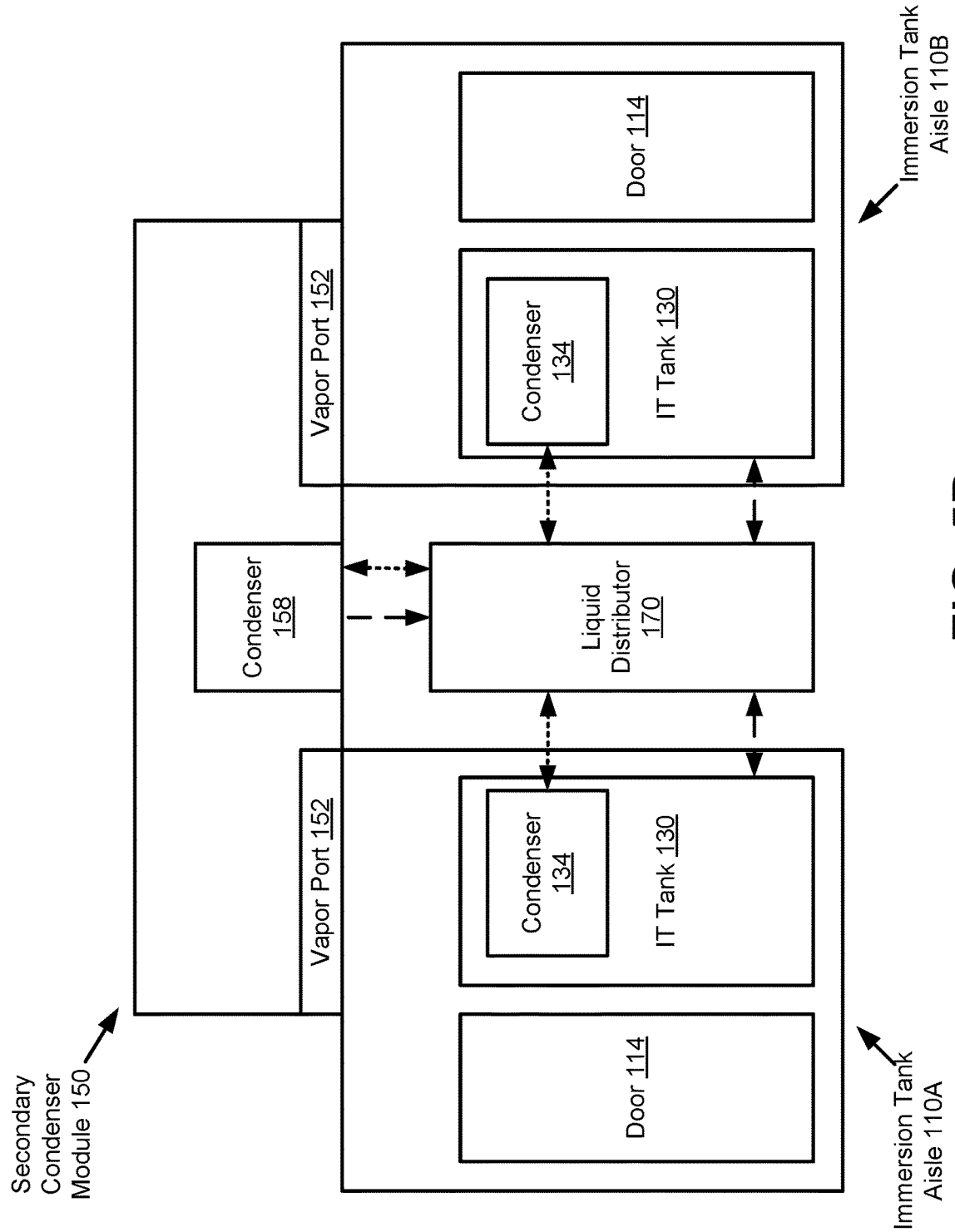
FIG. 5D is a block diagram illustrating a fourth arrangement of the system of FIG. 1 according to one embodiment.

FIG. 5D shows a diagram of a fourth arrangement of modularized components in accordance with one embodiment. In this figure, both liquid distributor 170 and secondary condenser module 150 are shared by two immersion tank aisles 100A, 100B. Secondary condenser module 150 may receive escaped two phase coolant vapor from both immersion tank aisles, condense it into two phase coolant, and provide it to liquid distributor 170. In turn, liquid distributor may distribute the various portions of two phase coolant (e.g., obtained using the escaped two phase coolant vapor from either of the immersion tank aisles) to the IT tanks of each of the immersion tank aisles 110A, 100B. Thus, either of the IT tanks may receive two phase coolant that had been previously used by the same or the other IT tank (and/or other IT tanks not shown herein).

Figure 5E:
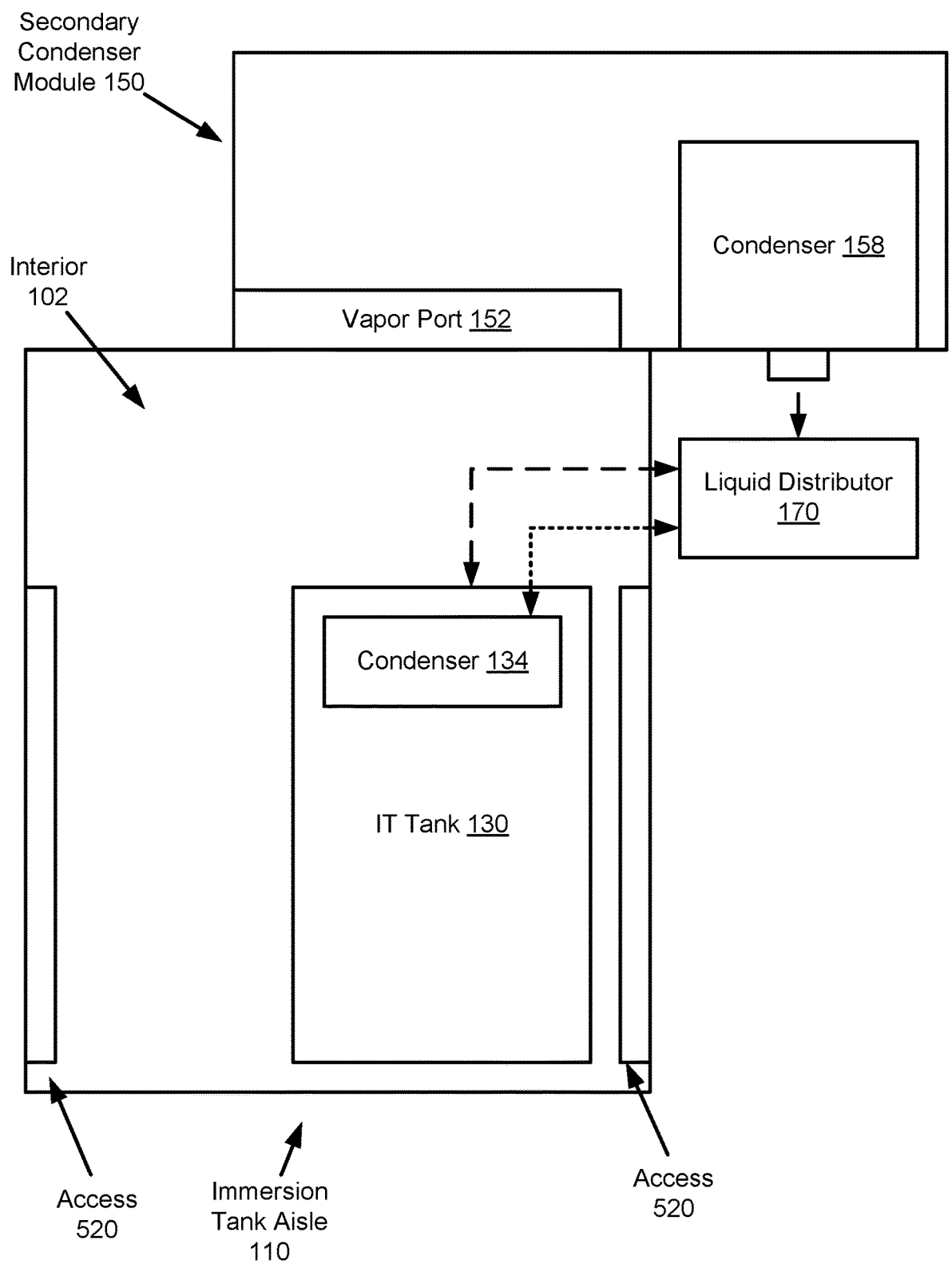
FIG. 5E is a block diagram illustrating a fifth arrangement of the system of FIG. 1 according to one embodiment.

FIG. 5E shows a diagram of a fifth arrangement of modularized components in accordance with one embodiment. In this figure, liquid distributor 170 is generally raised up to allow a person physical access to access 520 disposed on multiple faces of immersion tank aisle 110. By doing so, the person may have physical access to either side of IT tank 130 via the respective accesses 620 (e.g., doors, openings, etc.). In this manner, physical access to the devices disposed in IT tank 130 may be improved.

Any of FIGS. 5A-5E may represent a modularized unit in a data center environment. Different and/or similar modularized units may be repeated to a distributed computing environment in which computing devices disposed in the modularized units provide desired computer implemented services.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system, comprising:
    an immersion tank adapted to house a computing device at least partially submerged in two phase coolant contained therein;
    an aisle, in which the immersion tank is disposed, adapted to capture a first vaporized portion of the two phase coolant evaporated from the immersion tank;
    a first condenser adapted to transform the first vaporized portion of the two phase coolant that evaporated from the immersion tank into a first liquid portion of the two phase coolant;
    a second condenser disposed outside of the immersion tank and adapted to transform a second vaporized portion of the two phase coolant that escapes from the immersion tank into a second liquid portion of the two phase coolant; and
    a liquid distributor adapted to manage a quantity of the two phase coolant in the immersion tank, wherein the liquid distributor is further adapted to circulate cooling liquid to the first condenser and the second condenser.

2. The immersion cooling system of claim 1, wherein the cooling liquid is distributed to the first condenser and the second condenser by the liquid distributor to condense vaporized portions of the two phase coolant to liquid portions of the two phase coolant.

3. The immersion cooling system of claim 1, wherein the second condenser is adapted to direct the second liquid portion of the two phase coolant to the liquid distributor.

4. The immersion cooling system of claim 1, wherein the second condenser is disposed above the aisle and receives the second vaporized portion of the two phase coolant rising from the immersion tank.

5. The immersion cooling system of claim 1, wherein the liquid distributor is coupled to an external cooling fluid source and a two phase coolant source.

6. A data center, comprising:
a set of computing devices; and
an immersion cooling system, comprising:
  an immersion tank in which the set of computing devices are at least partially submerged in two phase coolant contained therein;
  an aisle, in which the immersion tank is disposed, adapted to capture a first vaporized portion of the two phase coolant evaporated from the immersion tank;
  a first condenser adapted to transform the first vaporized portion of the two phase coolant that evaporated from the immersion tank into a first liquid portion of the two phase coolant;
  a second condenser disposed outside of the immersion tank and adapted to transform a second vaporized portion of the two phase coolant that escapes from the immersion tank into a second liquid portion of the two phase coolant; and
  a liquid distributor adapted to manage a quantity of the two phase coolant in the immersion tank, wherein the liquid distributor is further adapted to circulate cooling liquid to the first condenser and the second condenser.

7. The data center of claim 6, wherein the liquid distributor is further adapted to distribute cooling liquid to the first condenser and the second condenser to condense vaporized portions of the two phase coolant to liquid portions of the two phase coolant.

8. The data center of claim 6, wherein the second condenser is adapted to direct the second liquid portion of the two phase coolant to the liquid distributor.

9. The data center of claim 6, wherein the second condenser is disposed above the aisle and receives the second vaporized portion of the two phase coolant rising from the immersion tank.

10. The data center of claim 6, wherein the liquid distributor is coupled to an external cooling fluid source and a two phase coolant source.

11. A modularized cooling system, comprising:
a first module comprising:
  an immersion tank adapted to house:
    a computing device that is at least partially submerged in two phase coolant contained therein,
    a first condenser that transforms a first vaporized portion of the two phase coolant in the immersion tank into a first liquid portion of the two phase coolant, and
  an aisle, in which the immersion tank is disposed, adapted to capture the first vaporized portion of the two phase coolant escaped from the immersion tank;
a second module comprising:
  a second condenser adapted to transform a second vaporized portion of the two phase coolant into a second liquid portion of the two phase coolant; and
a liquid distributor adapted to manage a quantity of the two phase coolant in the immersion tank, wherein the liquid distributor is further adapted to circulate cooling liquid to the first condenser and the second condenser.

12. The modularized cooling system of claim 11, wherein the second module is disposed above the first module.

13. The modularized cooling system of claim 11, wherein the liquid distributor is part of the first module.

14. The modularized cooling system of claim 11, the first module comprises two accesses for accessing and implementing the immersion tank disposed on opposite side of the aisle.

15. The modularized cooling system of claim 11, wherein the liquid distributor is shared by a first module and a secondary first module.

\* \* \* \* \*